(12) United States Patent
Boden et al.

(10) Patent No.: US 11,768,229 B2
(45) Date of Patent: Sep. 26, 2023

(54) PACKAGED CURRENT SENSOR INTEGRATED CIRCUIT

(71) Applicant: Allegro MicroSystems, LLC, Manchester, NH (US)

(72) Inventors: Bradley Boden, Manchester, NH (US); Rishikesh Nikam, Manchester, NH (US); Robert A. Briano, Auburn, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/654,254

(22) Filed: Mar. 10, 2022

(65) Prior Publication Data

US 2023/0058695 A1     Feb. 23, 2023

Related U.S. Application Data

(63) Continuation-in-part of application No. 17/409,011, filed on Aug. 23, 2021, now Pat. No. 11,519,946.

(51) Int. Cl.
*G01R 15/20* (2006.01)
*G01R 19/252* (2006.01)

(52) U.S. Cl.
CPC ......... *G01R 15/202* (2013.01); *G01R 15/207* (2013.01); *G01R 19/252* (2013.01)

(58) Field of Classification Search
CPC ... G01R 15/202; G01R 15/207; G01R 19/252
See application file for complete search history.

(56) References Cited

U.S. PATENT DOCUMENTS

| | | | | | |
|---|---|---|---|---|---|
| 5,255,157 | A | * | 10/1993 | Hegel | H01L 23/49805 257/E23.125 |
| 5,557,504 | A | * | 9/1996 | Siegel | H05K 7/1092 174/250 |
| 5,570,273 | A | * | 10/1996 | Siegel | H05K 7/1092 361/813 |

(Continued)

FOREIGN PATENT DOCUMENTS

| EP | 3671228 A1 * | 6/2020 | ............. G01R 15/20 |
|---|---|---|---|
| EP | 4141451 | 3/2023 | |

(Continued)

OTHER PUBLICATIONS

Steve Bush, DNP claims world's thinnest chip package,2009, https://www.electronicsweekly.com/news/products/micros/dnp-claims-worlds-thinnest-chip-package-2009-03/ (Year: 2009).*

(Continued)

*Primary Examiner* — Patrick Assouad
*Assistant Examiner* — Demetrius R Pretlow
(74) *Attorney, Agent, or Firm* — DALY, CROWLEY, MOFFORD & DURKEE, LLP (57) ABSTRACT

A packaged current sensor integrated circuit includes a primary conductor having an input portion and an output portion configured to carry a current to be measured by a magnetic sensing element supported by a semiconductor die adjacent to the primary conductor. The primary current path contains a mechanical locking feature. The thickness of the molded body of the package is reduced to improve vibration immunity.

19 Claims, 5 Drawing Sheets

(56) References Cited

U.S. PATENT DOCUMENTS

| | | | |
|---|---|---|---|
| 6,211,462 B1* | 4/2001 | Carter, Jr. | H01L 23/3107 174/532 |
| 6,326,243 B1* | 12/2001 | Suzuya | H01L 23/49503 438/126 |
| 6,356,068 B1 | 3/2002 | Steiner et al. | |
| 6,781,359 B2 | 8/2004 | Stauth et al. | |
| 6,995,315 B2 | 2/2006 | Sharma et al. | |
| 7,005,754 B2* | 2/2006 | Howarth | H01L 23/544 257/E23.179 |
| 7,075,287 B1 | 7/2006 | Mangtani et al. | |
| 7,166,807 B2 | 1/2007 | Gagnon et al. | |
| 7,265,531 B2 | 9/2007 | Stauth et al. | |
| 7,372,147 B2* | 5/2008 | Dai | H05K 3/303 257/E23.083 |
| 7,476,816 B2 | 1/2009 | Doogue et al. | |
| 7,554,180 B2* | 6/2009 | McKerreghan | H01L 29/0657 257/E29.345 |
| 7,598,601 B2 | 10/2009 | Taylor et al. | |
| 7,709,754 B2 | 5/2010 | Doogue et al. | |
| 7,816,905 B2* | 10/2010 | Doogue | G01R 15/207 324/117 H |
| 8,080,994 B2 | 12/2011 | Taylor et al. | |
| 8,604,777 B2* | 12/2013 | Doogue | G01R 35/005 361/93.6 |
| 8,629,539 B2 | 1/2014 | Milano et al. | |
| 8,907,437 B2* | 12/2014 | Milano | G01R 15/207 257/E27.005 |
| 9,190,606 B2 | 11/2015 | Liu et al. | |
| 9,299,915 B2 | 3/2016 | Milano et al. | |
| 9,383,425 B2* | 7/2016 | Milano | G01R 31/2829 |
| 9,494,660 B2 | 11/2016 | David et al. | |
| 9,620,705 B2 | 4/2017 | Milano et al. | |
| 9,666,788 B2 | 5/2017 | Taylor et al. | |
| 9,788,403 B2* | 10/2017 | Mrusek | H05G 1/20 |
| 9,812,588 B2 | 11/2017 | Vig et al. | |
| 9,865,807 B2 | 1/2018 | Liu et al. | |
| 10,230,006 B2 | 3/2019 | Vig et al. | |
| 10,234,513 B2* | 3/2019 | Vig | G01R 33/0047 |
| 10,333,055 B2 | 6/2019 | Milano et al. | |
| 10,345,343 B2 | 7/2019 | Milano et al. | |
| 10,509,058 B2 | 12/2019 | Cadugan et al. | |
| 10,578,684 B2 | 3/2020 | Cadugan et al. | |
| 10,718,794 B2 | 7/2020 | El Bacha et al. | |
| 10,753,963 B2 | 8/2020 | Milano et al. | |
| 10,916,665 B2 | 2/2021 | Vig et al. | |
| 11,024,576 B1 | 6/2021 | West et al. | |
| 11,085,952 B2 | 8/2021 | Cadugan et al. | |
| 2002/0190703 A1 | 12/2002 | Goto et al. | |
| 2003/0193018 A1* | 10/2003 | Tao | H01L 27/14618 250/239 |
| 2004/0124505 A1* | 7/2004 | Mahle | H01L 23/49548 257/666 |
| 2005/0030018 A1 | 2/2005 | Shibahara et al. | |
| 2005/0124185 A1* | 6/2005 | Cromwell | H05K 3/301 439/71 |
| 2007/0126092 A1* | 6/2007 | San Antonio | H01L 21/568 438/123 |
| 2007/0279053 A1 | 12/2007 | Taylor et al. | |
| 2008/0297138 A1 | 12/2008 | Taylor et al. | |
| 2010/0156394 A1* | 6/2010 | Ausserlechner | G01R 15/202 324/144 |
| 2011/0049685 A1* | 3/2011 | Park | H01L 23/3107 257/E23.114 |
| 2011/0234215 A1 | 9/2011 | Ausserlechner | |
| 2011/0248711 A1* | 10/2011 | Ausserlechner | G01R 19/0092 324/251 |
| 2012/0089266 A1* | 4/2012 | Tomimbang | G01R 31/50 700/293 |
| 2013/0015843 A1* | 1/2013 | Doogue | G01R 15/148 324/202 |
| 2013/0020660 A1* | 1/2013 | Milano | G01R 15/207 257/E27.005 |
| 2013/0138372 A1 | 5/2013 | Ausserlechner | |
| 2014/0253103 A1 | 9/2014 | Racz et al. | |
| 2014/0264678 A1 | 9/2014 | Liu et al. | |
| 2014/0266181 A1 | 9/2014 | Milano et al. | |
| 2015/0108967 A1* | 4/2015 | Barczyk | G01R 15/185 324/202 |
| 2015/0270198 A1* | 9/2015 | Cuoco | H01L 23/49811 257/670 |
| 2016/0187388 A1 | 6/2016 | Suzuki et al. | |
| 2016/0216296 A1* | 7/2016 | Nakayama | G01R 15/202 |
| 2016/0223594 A1 | 8/2016 | Suzuki et al. | |
| 2016/0282388 A1* | 9/2016 | Milano | H10N 50/10 |
| 2016/0282425 A1* | 9/2016 | Haas | G01R 33/0017 |
| 2016/0313375 A1 | 10/2016 | Etschmaier | |
| 2017/0179067 A1* | 6/2017 | Aoki | H05K 3/3436 |
| 2017/0336481 A1* | 11/2017 | Latham | G01R 35/005 |
| 2018/0149677 A1* | 5/2018 | Milano | G01R 15/148 |
| 2018/0166350 A1* | 6/2018 | Racz | H01L 21/4842 |
| 2018/0306843 A1* | 10/2018 | Bussing | G01R 15/207 |
| 2019/0049527 A1 | 2/2019 | Vig et al. | |
| 2019/0109072 A1* | 4/2019 | David | H01L 23/49575 |
| 2019/0154737 A1* | 5/2019 | Nobira | G01R 15/20 |
| 2019/0204363 A1 | 7/2019 | Suzuki et al. | |
| 2019/0369144 A1 | 12/2019 | Mauder et al. | |
| 2020/0033384 A1* | 1/2020 | Kishi | G01R 15/207 |
| 2020/0064382 A1 | 2/2020 | Takata et al. | |
| 2020/0191835 A1* | 6/2020 | Bilbao De Mendizabal | G01R 19/32 |
| 2021/0082789 A1 | 3/2021 | Briano et al. | |
| 2021/0111284 A1 | 4/2021 | Vig et al. | |
| 2021/0243911 A1* | 8/2021 | Tang | G01R 1/04 |
| 2021/0263077 A1* | 8/2021 | Hirano | G01R 15/202 |
| 2021/0397015 A1* | 12/2021 | Moon | G02B 27/646 |
| 2022/0018880 A1* | 1/2022 | Houis | G01R 15/207 |

FOREIGN PATENT DOCUMENTS

| | | | |
|---|---|---|---|
| FR | 3090121 | 6/2020 | |
| WO | WO-2014149448 A1 * | 9/2014 | G01R 15/207 |

OTHER PUBLICATIONS

U.S. Appl. No. 18/053,480, filed Nov. 8, 2022, Liu, et al.
European Extended Search Reporting dated Dec. 22, 2022 for European Application No. 22183450.0; 7 pages.
U.S. Notice of Allowance dated Aug. 23, 2022 for U.S. Appl. No. 17/409,011; 10 pages.
U.S. Appl. No. 17/409,011, filed Aug. 23, 2021, Rock, et al.
Search Report and Written Opinion dated Apr. 25, 2023 for PCT Application No. PCT/US2022/051968; 16 pages.
U.S. Appl. No. 18/182,434, filed Mar. 13, 2023, Liu.
European Response filed on Jun. 14, 2023 for European Application No. 22183450.0; 24 pages.

* cited by examiner

Top view

Bottom view

FIG. 1B

Side view

PACKAGED CURRENT SENSOR INTEGRATED CIRCUIT

CROSS REFERENCE TO RELATED APPLICATIONS

This application is a Continuation-in-Part application and claims priority to and the benefit of U.S. patent application Ser. No. 17/409,011, entitled "Packaged Current Sensor Integrated Circuit" and filed Aug. 23, 2021, which is incorporated herein by reference.

BACKGROUND

Some conventional current sensors are positioned near a current-carrying conductor to sense a magnetic field generated by a current through the conductor. The current sensor generates an output signal having a magnitude proportional to the magnetic field induced by the current through the conductor.

SUMMARY

According to the disclosure, a packaged current sensor integrated circuit includes a primary conductor having an input lead and an output lead, a first die attach portion, a second die attach portion and a current conductor portion between the first and second die attach portions, wherein the primary conductor is configured to carry a current from the input lead through the first die attach portion, the current conductor portion, the second die attach portion, to the output lead, wherein at least one of the first and second die attach portions has a die attach portion edge adjacent to the respective one of the input or output lead. The packaged current sensor integrated circuit further includes a mechanical locking feature spaced from the die attach portion edge, at least one secondary lead, a semiconductor die supported by the first and second die attach portions, at least one magnetic field sensing element supported by the semiconductor die, wherein at the least one magnetic field sensing element is positioned adjacent to the current conductor portion, and a package body enclosing the semiconductor die and at least a portion of the primary conductor, wherein the input lead and the output lead extend from a first side of the package body, and the at least one secondary lead extends from a second side of the package body opposite to the first side of the package body.

Features may include one or more of the following individually or in combination with other features. The packaged current sensor integrated circuit can further include at least three secondary leads. The at least one secondary lead can provide an output connection, a voltage input connection, and a ground connection. The packaged current sensor integrated circuit can further include a front-end amplifier, wherein the at least one magnetic field sensing element is connected to the front-end amplifier. The at least one magnetic field sensing element can be a Hall effect sensor. The packaged current sensor integrated circuit can further include a Hall effect current drive circuit connected to the Hall effect sensor. The Hall effect sensor can be positioned adjacent to the current conductor portion of the primary conductor. The at least one magnetic field sensing element can include a first Hall effect sensor positioned adjacent to a first side of the current conductor portion and the packaged current sensor integrated circuit can further include a second Hall effect sensor positioned adjacent to a second side of the current conductor portion opposite to the first side. A front end amplifier can be connected to an amplifier to provide an output of the current level in the primary conductor. The packaged current sensor integrated circuit can further include a wafer backside coating material on a back side of the semiconductor die. The packaged current sensor integrated circuit can further include a second wafer backside coating material on the back of the semiconductor die. The distance between the primary conductor lead frame and the at least one secondary lead frame can be at least 0.125 mm. The mechanical locking feature can be spaced from the die attach edge portion by at least 0.50 mm. The current conductor portion of the primary conductor can have shaped conductor regions. The thickness of the package body can be less than 1.0 mm. The thickness of the primary conductor lead frame can be between 0.140 mm and 0.162 mm.

Also described is a method of sensing a current in a current sensor integrated circuit package including providing a primary conductor having an input lead and an output lead, a first die attach portion, a second die attach portion and a primary conductor portion, wherein the primary conductor is configured to carry a current from the input lead through the first die attach portion, the primary conductor portion, the second die attach portion, and the output lead. The method further includes providing a mechanical locking feature in the primary conductor spaced from a die attach portion edge, providing at least one secondary lead, providing a semiconductor die disposed adjacent to the primary conductor, providing at least one magnetic field sensing element supported by the semiconductor die, wherein at the least one magnetic field sensing element is positioned near the primary conductor portion and providing an output signal representative of the current in the primary conductor.

Features may include one or more of the following individually or in combination with other features. The method may include providing the at least one magnetic field sensing element as a first magnetic field sensing element disposed adjacent to a first side of the current conductor portion and the method may further include providing a second magnetic field sensing element disposed adjacent to a second side of the current conductor portion opposite to the first side. The method may further include providing the magnetic field sensing element as one of a planar Hall effect element, a vertical Hall effect element, a anisotropic magnetoresistance (amr) element, a giant magnetoresistance (gmr) element, or a tunneling magnetoresistance (tmr) element.

BRIEF DESCRIPTION OF DRAWINGS

The foregoing features of this disclosure, as well as the disclosure itself, may be more fully understood from the following description of the drawings in which.

DETAILED DESCRIPTION

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half-bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "processor" or "controller" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital. A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but will be readily understood by one of ordinary skill in the art.

In particular, it should be understood that a so-called comparator can comprise an analog comparator having a two state output signal indicative of an input signal being above or below a threshold level (or indicative of one input signal being above or below another input signal). However, the comparator can also comprise a digital circuit having an output signal with at least two states indicative of an input signal being above or below a threshold level (or indicative of one input signal being above or below another input signal), respectively, or a digital value above or below a digital threshold value (or another digital value), respectively.

Figure 1:
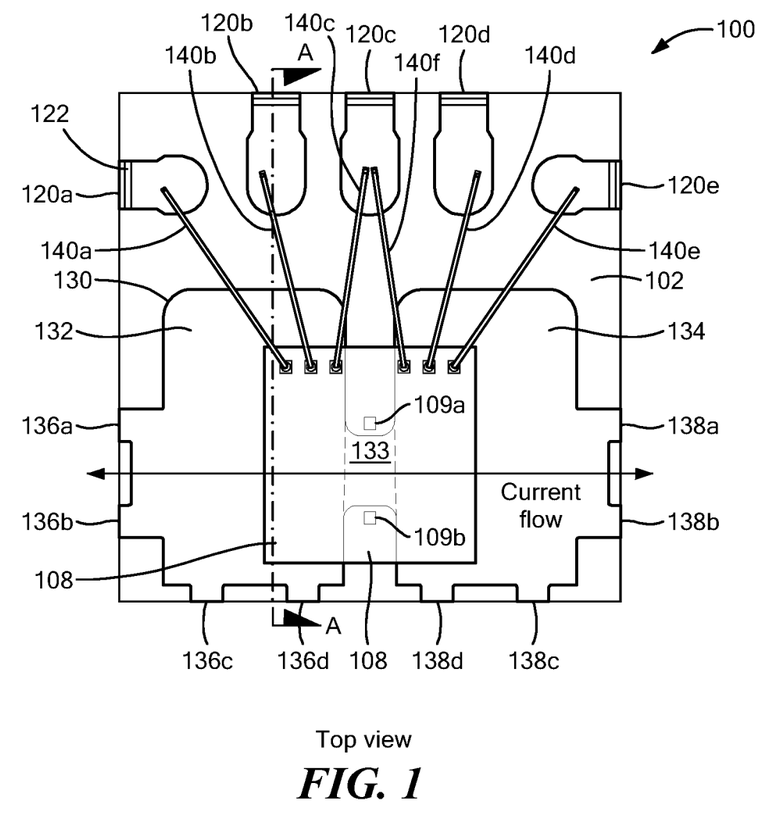
FIG. 1 provides a top view of a packaged current sensor integrated circuit.

FIG. 1 shows a top view of a packaged current sensor integrated circuit 100. The package body 102 may be a mold compound and is shown as an outline for clarity.

A primary conductor 130 has input and output portions that can include die attach portions 132, 134, respectively, which support a semiconductor die 108. Primary conductor 130 has input and output leads 136a, 136b on a first side of the package and 136c, 136d on a second side of the package, and 138a, 138b on a third side of the package, 138c, 138d on said second side of the package. Input leads 136a, 136b, 136c, 136d are connected to die attach pad 132 and output leads 138a, 138b, 138c, 138d are connected to die attach pad 134.

The current sensor integrated circuit 100 also has secondary leads 120a, 120b, 120c, 120d, 120e. Wire bonds 140a, 140b, 140c, 140d, 140e, 140f connect the die 108 to the secondary, or signal leads, 120a, 120b, 120c, 120d, 120e. Secondary lead 120c is connected to die 108 using two wire bonds 140c, 140e. This may be advantageous when a potential for higher current may exist, such as for a power or ground connection to die 108.

A current path portion 133 of the primary conductor can interconnect die attach pads 132, 134 and can be a narrowed portion, as shown. The primary conductor 130 has a partial current path that forms a straight line across the package body from a first side of the package with leads 136a, 136b to a third side of the package with leads 138a, 138b. Die 108 supports at least one magnetic field sensing element, and in FIG. 1 two magnetic field sensing elements 109a, 109b. The die 108 can also support circuitry to amplify and process the signals from the magnetic field sensing elements and provide an output of the current sensor integrated circuit 100. As current flows through the current conductor portion 133, a magnetic field is generated and may be sensed by magnetic field sensing elements 109a, 109b. In FIG. 1, magnetic field sensing elements 109a, 109b are positioned off of or to the side of the current conductor portion 133 so that the magnetic field generated by the current flowing in the current conductor portion 133 has a direction component that is perpendicular to the die such that a planar Hall effect sensor may be used for magnetic field sensing elements 109a, 109b. In other embodiments, the magnetic field sensing elements, or element may be positioned over the primary current conductor portion to sense a magnetic field with a component parallel to the surface of die 108. In a case where the magnetic field component to be sensed is parallel to the surface of the die, a magnetoresistance element such as a vertical Hall element, a GMR, TMR, or AMR element may be used.

Figure 1A:
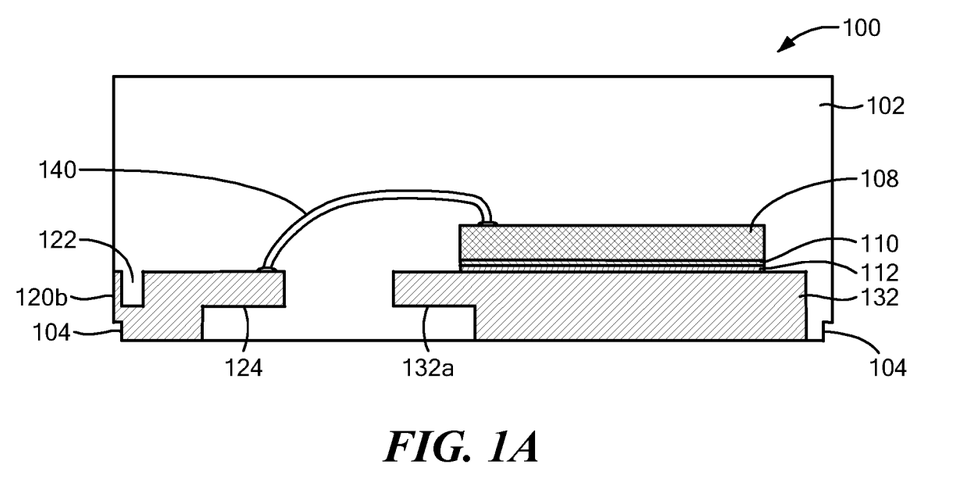
FIG. 1A shows a cross-sectional side view of the packaged current sensor integrated circuit package of FIG. 1.

Referring also to FIG. 1A, in which like elements are labeled with like reference numbers, a cross-sectional side view of the packaged current sensor integrated circuit 100 taken along the line A-A of FIG. 1 is shown. The package body 102 may have a recessed portion 104 around the bottom of the package. Die 108 is supported by the primary conductor die attach portion 132 which has a thinned portion 132a. Die 108 may be attached to the die attach portion 132 by a non-conductive coating, such as a wafer backside coating (WBC), shown as two layers 110, 112. In manufacturing, if two layers of wafer backside coating 110, 112 are used, the first wafer backside coating layer 110 may be fully cured (or partially cured if only one layer of a wafer backside coating is used) before a second layer of wafer backside coating 112 is partially cured (also known as B stage cured) is used to eventually attach die 108 to die attach portion 132 of the primary conductor 130 of FIG. 1.

In another embodiment the die 108 may be attached to the die attach portion 132 by other materials, including but not limited to by a non-conductive die attach epoxy, or a tape. Multiple layers of wafer backside coating, tape, and non-conductive epoxy may be used for electrical isolation. A combination of wafer backside coating, tape, or non-conductive epoxy may be used to achieve electrical isolation and attachment to the die attach portion 132.

Die 108 can be electrically connected to secondary lead 120b with a wire bond 140. Secondary lead 120b can have a recessed portion 122 and/or a thinned portion 124 which provide locking features with the mold compound 102. The thinned portion 124 may be the result of a half etch lead frame process. An example of a half etch process is when the lead frame is etched from two sides and on one etch side is masked, or patterned so that a partial thickness (or roughly half) of the lead frame remains at a portion of a lead or the lead frame. The package body 102 and secondary lead 102b may have cutouts or recessed portions 104, which in an embodiment may be around all of the bottom edges of the packaged current sensor integrated circuit 100.

Figure 1B:
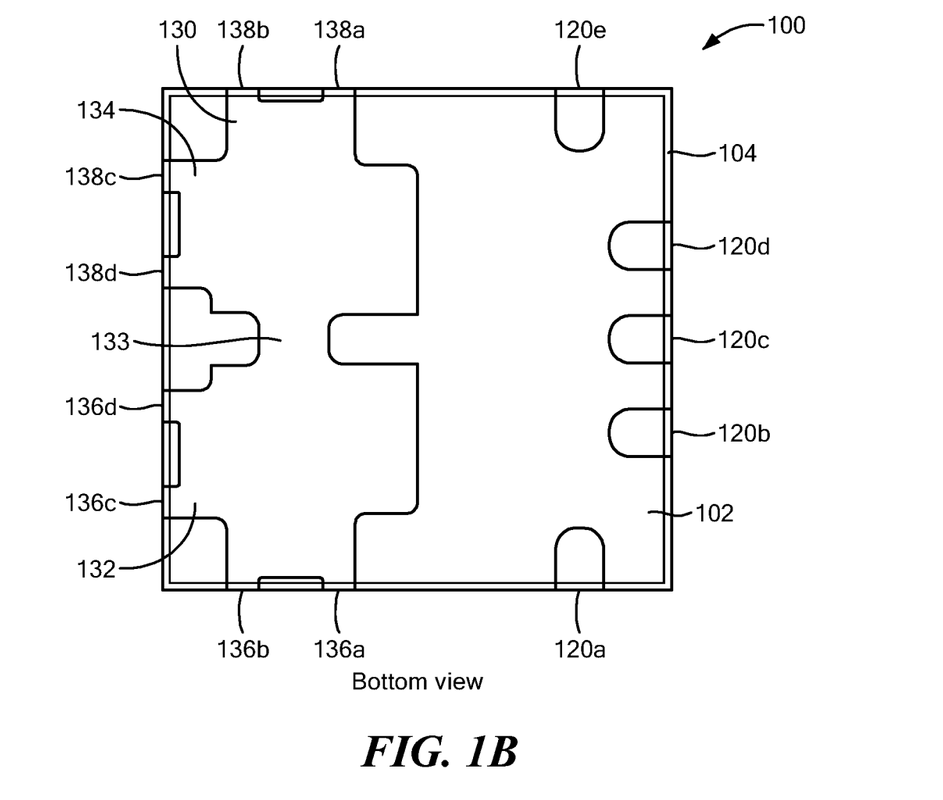
FIG. 1B shows a bottom view of the packaged current sensor integrated circuit of FIG. 1.

Referring also to FIG. 1B, in which like elements are labeled with like reference numbers, a bottom view of the packaged current sensor integrated circuit 100 is shown. Secondary leads 120a, 120b, 120c, 120d, 120e have an exposed portion on the bottom of the package 100. Primary current conductor 130 is shown with at least a portion of die attach portions 132, 134, current conductor portion 133, and leads 136a, 136b, 136c, 136d, 138a, 138b, 138c, 138d exposed on the bottom of package 100. In use, exposed portions of the die attach pads 132, 134 may be connected to a circuit board or other substrate and, due to the larger area of connection possible between the board and the primary conductor 130, the resistance of the connection may be lower, which results in lower power loss due to the connection resistance of the current sensor package 100 to a circuit board. In another embodiment, a solder connection may also be provided with the current conductor portion 133. If the solder connection or a current path is under the area 133, the current sensor IC accuracy may be improved if the gain of the current sensor integrated circuit is programmed with the current path of the current conductor portion 133 in parallel with a solder and PC board conductor.

Figure 1C:
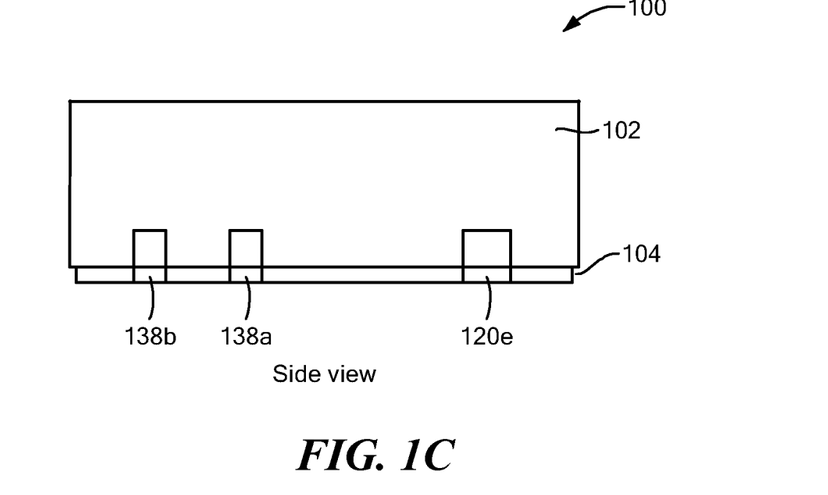
FIG. 1C shows a side view of the packaged current sensor integrated circuit of FIG. 1.

Referring also to FIG. 1C, in which like elements are labeled with like reference numbers, a side view of the packaged current sensor integrated circuit 100 is shown. Primary conductor input/output leads 138a, 138b and signal, or secondary lead 120e are exposed and approximately even with the plastic of the package body 102. The distance between the secondary lead 120e and primary lead 138a is selected to meet an electrical isolation requirement of the application. In an embodiment the spacing from the primary to the secondary leads is at least 1.0 mm on the surface, or outside, or the package to allow for a voltage isolation rating of 100V.

Recessed portion 104 of the package body 102 and leads 138a, 138b, 120e is shown around the bottom edge of the package. This recessed portion 104 can be used when the packaged current sensor integrated circuit 100 is assembled to a printed circuit board or other assembly to inspect or check for solder connections between the package 100 and the PC Board or assembly.

In an embodiment, the primary conductor 130 and secondary leads 120a-e can have a thickness on the order of 0.2 mm to 0.5 mm. In another embodiment the primary and secondary leads have a thickness of 0.375 mm, ranging in some cases from 0.35 to 0.40 mm, which is thicker than a standard integrated circuit package, where a standard thickness may be on the order of 0.2 mm-0.25 mm+/−0.025 mm for manufacturing tolerance. The thicker primary conductor serves to increase the cross-sectional area perpendicular to the current flow. The increased thickness of the current conductor material in the primary conductor 130 and current path portion 133 reduces power loss in a system which utilizes the current sensor package 100 of FIG. 1.

As noted above, the recessed portion 104 of the package body 102 can facilitate inspection of the packaged current sensor integrated circuit 100 once it is put into use (e.g., soldered to a circuit board). Because of the configuration of primary conductor leads 136a-136d, 138a-138d, such inspection can be made from three sides of the packaged circuit 100. The leads 136a, 136b and 136c, 136d of primary conductor 130 allow the inspection of the solder on adjacent sides of the package which are substantially orthogonal to each other as shown in FIG. 1 and FIG. 1B. Likewise, leads 138a, 138b and 138c, 138d allow inspection of the solder on adjacent sides of the package which are substantially orthogonal to each other. Leads 136c, 136d and 138c, 138d are on the same side of the package 100.

In another embodiment, the lead frame thickness may be a standard lead frame thickness. The primary current planned to be sensed by the current sensor package 100 or the absolute resistance required by an application can determine the thickness of the lead frame that is required.

Figure 2:
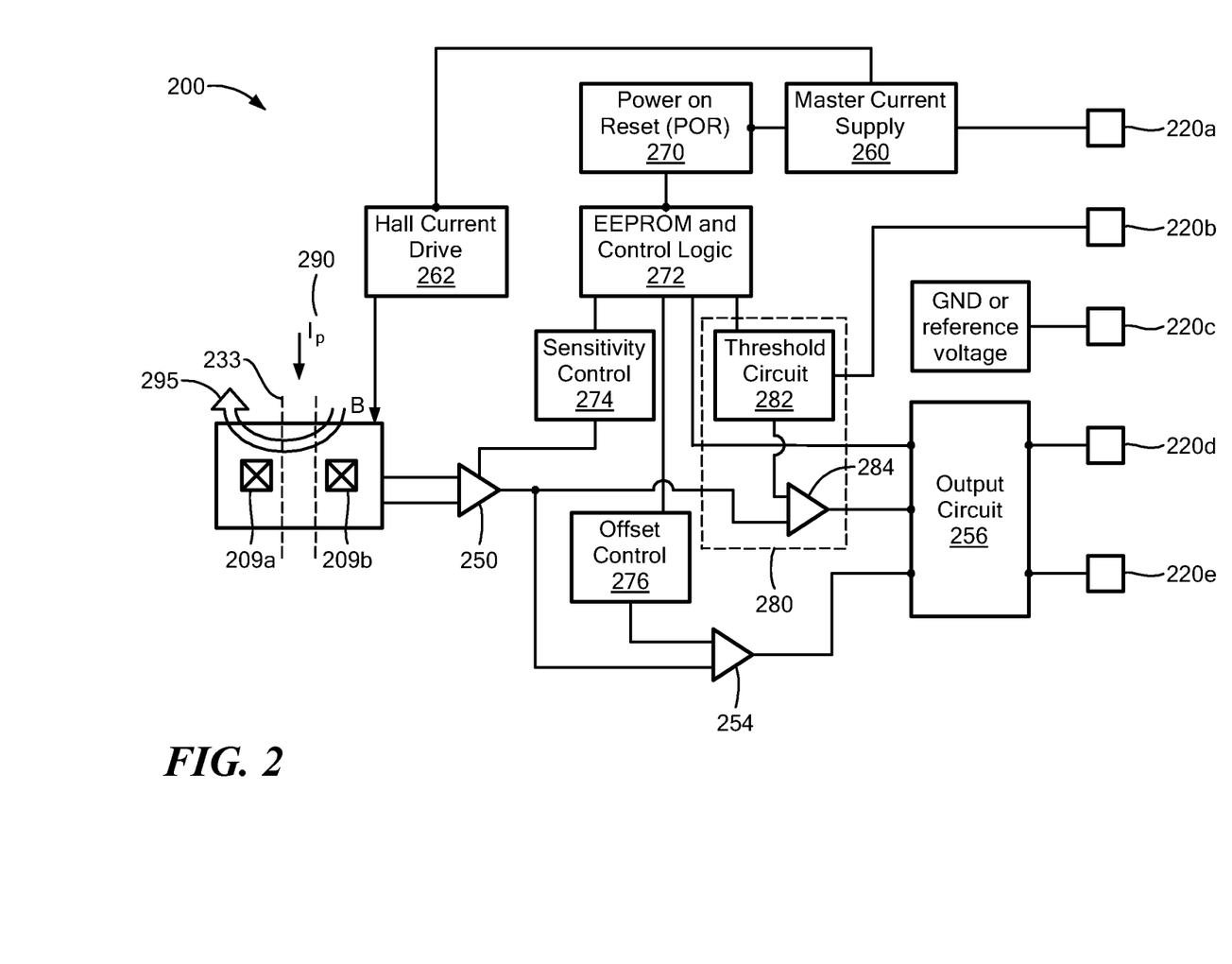
FIG. 2 provides an example circuit for a die in the packaged current sensor integrated circuit of FIG. 1.

Referring also to FIG. 2, a schematic of an example circuit block diagram for an integrated circuit 200 which may be on the die 108 in FIG. 1 is shown. The primary current $I_p$ 290 flows through a current conductor portion 233 (that may be the same as or similar to primary conductor 130 of FIG. 1) and generates a magnetic field B 295. The magnetic field B 295 contains a component which comes up into the die at magnetic field sensing element 209b and down into the magnetic field sensing element 209a for a current flowing from top to bottom in FIG. 2 (following the right-hand rule) when the current conductor portion 233 is below the die 200. The magnetic field sensing elements 209a, 209b may be planar Hall effect plates for example. The magnetic field 295 results in Hall effect plates 209a, 209b providing a signal to a front-end amplifier 250. The front-end amplifier 250 provides an output to amplifier 254, which may be a linear amplifier, which feeds into an output circuit 256. Output circuit 256 may be a digital or analog circuit that provides an output to at least one bond pad, or as shown in FIG. 2 two bond pads 220d, 220e. Output bond pad 220e may be a linear output that represents the magnetic field 295 measured and amplified through the amplifier 254. Other numbers of output bond pads more than two may also be provided. In an alternate embodiment, the amplifier 254 may provide an output directly to a bond pad 220e. Output bond pad 220d may be a fault output representative of a fault condition in the current sensor integrated circuit package.

Bond pad 220a provides a voltage and current input, typically Vcc, to provide power to the integrated circuit 200. A ground bond pad 220c may be provided to integrated circuit 200. In another embodiment, the voltage level provided at bond pad 220c may be other than ground, or a voltage above or below ground as a reference voltage to integrated circuit 200. Input bond pad 220a is coupled to a master current supply circuit 260 that provides power to the circuitry within integrated circuit 200. Although master current supply 260 is provided as a current supply, it would be apparent that voltages may also be provided to the circuits on integrated circuit 200. A Hall effect current drive circuit 262 takes current (or voltage) from the master current supply 260 and provides a regulated current to the Hall Effect sensing elements 209a, 209b. The master current supply 260 also provides power to a power on reset circuit 270. The power on reset circuit monitors the power coming into the circuit 200 and provides a signal to EEPROM and control logic circuit 272. The power on reset circuit 270 and EEPROM and control logic circuit 272 are used to configure and enable the integrated circuit, including the output circuit 256.

The EEPROM and control circuit 272 provides a signal to a sensitivity control circuit 274 which provides a signal to the front end amplifier 250 to adjust the sensitivity of the front end amplifier. The adjustment may be the result of a change in the power level in the circuit 200, or as a result of a temperature change of the circuit 200. The temperature sensor circuit is not shown in FIG. 2. An example of a temperature sensor circuit may include but is not limited to a diode temperature sensor, or the use of known temperature compensation resistors.

The EEPROM and control circuit 272 provides a signal to an offset control circuit 276. The offset control circuit 276 provides a signal to the amplifier 254. The offset control circuit 276 allows the circuit 200 to adjust the offset of the amplifier 254 for changes in power or temperature (the temperature compensation circuit is not shown) or a combination of temperature and power changes. The offset control circuit 276 may also provide adjustment for other offset sources, such as a stress in the integrated circuit die.

In another embodiment the EEPROM in the EEPROM and control circuit 272 may be replaced by another type of memory or used in combination with another type of non-volatile memory, including but not limited to a metal or polysilicon fuse, flash memory, or MRAM.

An input lead 220b may be provided to set a threshold for a fault indication circuit 280 (i.e., provide a fault trip level). In an embodiment the input lead 220b provides a fault voltage level. The fault indication circuit 280 consists of a threshold circuit 282 and a fault comparator 284. The EEPROM and control circuit 272 provides an input to the threshold circuit 282. The threshold circuit 282 provides a signal to the fault comparator 284, which compares the output of threshold circuit 282 with the output of the front end amplifier 250 to indicate when a fault exists to the output circuit block 256. The output circuit generates a fault output at output bond pad 220d. The fault output may indicate an overcurrent condition in which the current sensed in the current conductor path 233 exceeds a fault trip level, which trip level may be provided in the form of a fault voltage level on bond pad 220b. The fault allows, in one example, the user of the current sensor package 100 in FIG. 1 to turn off the current in the primary current path in order to prevent a high current condition in an electrical circuit connected to the primary conductor 130 of FIG. 1.

In an embodiment, functionality of the fault indication circuit 280 may be performed in a digital circuit or digital processor. The comparison to the fault trip level may include an analog to digital circuit (ADC) prior to a digital logic circuit, which may include a processor or microprocessor circuit, which compares the fault trip level voltage to a voltage provided by the front end amplifier and an ADC circuit to convert the analog voltage of the front end amplifier 250 to a digital voltage. In an embodiment, the amplifier 250 may be a buffer amplifier with a gain near or equal to unity (or one). In another embodiment, the amplifier 254 may be introduce a non-unity gain.

In an embodiment, a multiplexer circuit may be used to allow for the output of front end amplifier circuit 250 and the fault trip level voltage to use the same ADC. It will be apparent to those of ordinary skill in the art that other circuits, such as timing circuits and sample and hold circuits, may be used to implement a multiplexed digital circuit.

Figure 3:
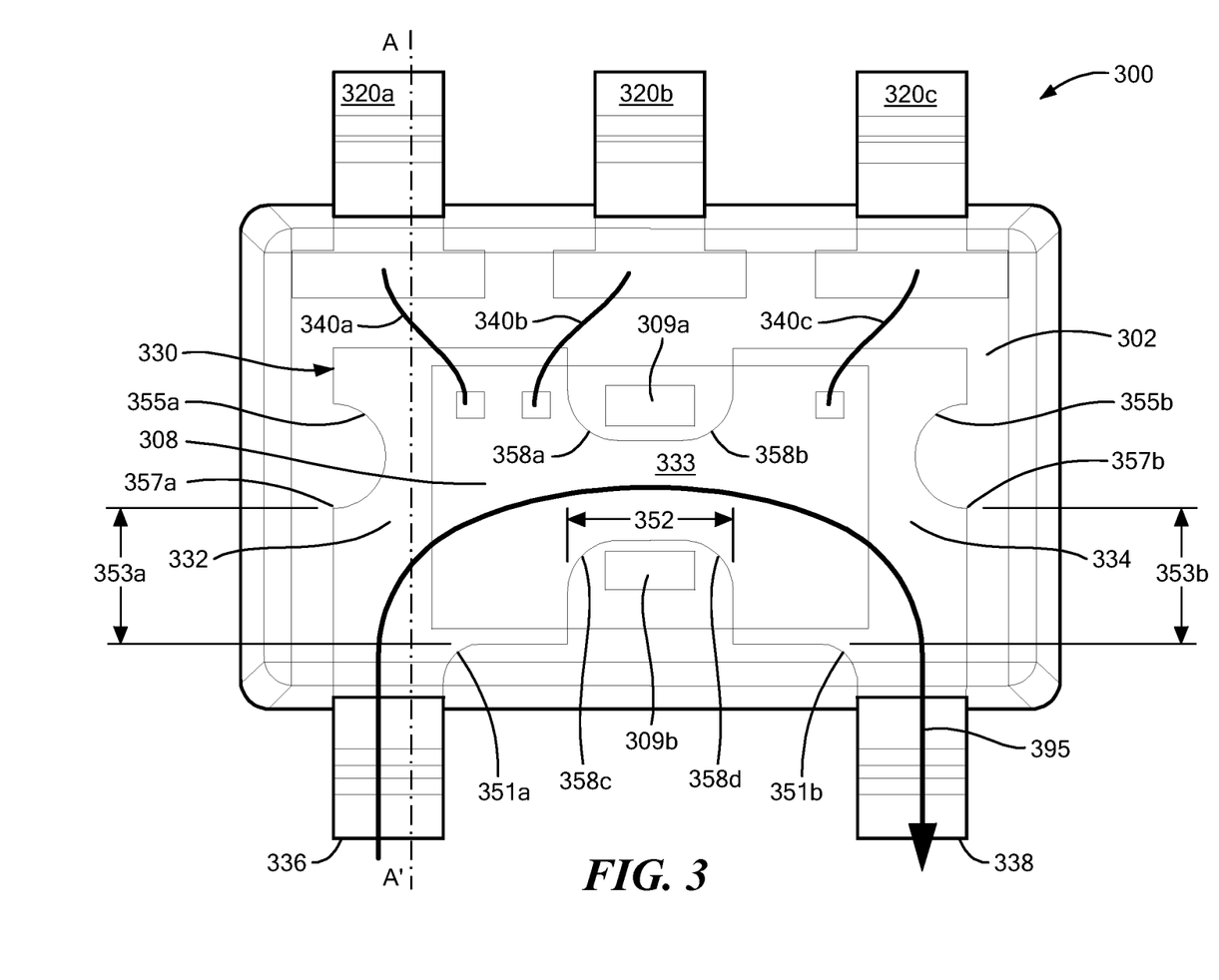
FIG. 3 provides a top view of a packaged integrated circuit with a small form factor.

FIG. 3 shows a top view of a packaged current sensor integrated circuit 300 which can be manufactured in a small package body, for example a package with a top view dimension of the molded package body of approximately 2.98 mm×1.95 mm and a thickness of 1.00 mm. The package body 302 may be a mold compound and is shown as an outline for clarity. The current sensor integrated circuit 300 of FIG. 3 uses a thinner lead frame material than other integrated current sensors, which allows the package dimensions to be reduced. A smaller package allows the current sensor integrated circuit of FIG. 3 to require less space when assembled or used on a board, circuit assembly, or module. A thinner package can allow the package to have more vibration immunity when compared to a thicker molded package body. A standard SOIC-8 style package may have a size on the order of 4.9 mm×3.9 mm×1.47 mm. An industry standard SOT23 package may have dimensions on the order of 2.90 mm×1.60 mm×1.15 mm. Although the length and width of the described package are larger than a standard SOT23 package, reducing the package thickness from 1.15 mm in a standard SOT23 to 1.00 mm or less in the described package which can increase vibration immunity, or reduce the effects of mechanical vibrations in a current sensor application.

A primary conductor 330 has input and output portions and includes input lead 336, output lead 338, and die attach portions 332, 334, which support a semiconductor die 308. Primary conductor 330 has input lead 336 and output lead 338 on a first side of the package. Input lead 336 is connected to die attach pad 332 and output lead 338 is connected to die attach pad 334.

The current sensor integrated circuit 300 also has secondary leads 320a, 320b, 320c. Wire bonds 340a, 340b, 340c connect the die 308 to the secondary, or signal leads, 320a,

320b, 320c. In an embodiment a low loop height wire bond process may be used to allow reduction of the package body thickness.

A current path 395 of the primary conductor lead frame includes input lead 336, die attach portion 332, current conductor portion 333, die attach portion 334, and output lead 338 of the primary conductor 330. Current conductor portion 333 connects die attach pads 332, 334 and can be a narrowed portion, as shown in FIG. 3. Die 308 supports two magnetic field sensing elements, 309a, 309b. The die 308 can also support circuitry to amplify and process the signals from the magnetic field sensing elements and provide an output of the current sensor integrated circuit 300. As current flows through the current conductor portion 333, a magnetic field is generated and may be sensed by magnetic field sensing elements 309a, 309b. In FIG. 3, magnetic field sensing elements 309a, 309b are positioned on die 308 and to the side of the current conductor portion 333 so that the magnetic field generated by the current flowing in the current conductor portion 333 has a direction component that is perpendicular to the die 308 in area where magnetic field sensing elements 309a, 309b are positioned such that, for example, a planar Hall effect sensor may be used for magnetic field sensing elements 309a, 309b. In other embodiments, the magnetic field sensing elements, or element may be positioned over the primary current conductor portion to sense a magnetic field with a component parallel to the surface of die 308. In a case where the magnetic field component to be sensed is parallel to the surface of the die, a vertical Hall effect element or a magnetoresistance element such as a GMR, TMR, or AMR element may be used.

The use of two magnetic field sensing element 309a, 309b allows for improved stray field immunity to help reduce the impacts of outside magnetic fields on the current sensor integrated circuit 300. For example, for current flowing as shown by arrow 395, from left to right across the figure from input lead 336 to output lead 338 a magnetic field out of the page is observed by sensing element 309a, and a magnetic field into the page is observed by sensing element in area 309b. A summing circuit may be used to calculate the magnetic field proportional to the current flowing in the current conductor portion 333. Sensing elements 309a, 309b can be positioned or biased such that any stray, or common external magnetic field results in the effect on one sensing element 309a being positive and the other sensing element 309b being negative such that when summed, the external field is cancelled, but the expected magnetic field generated by the current in the primary conductor has a value of, for example, two times the value from either magnetic sensing element.

Other magnetic field sensing elements, such as vertical Hall, a GMR, or TMR magnetic field sensing element or elements may be positioned over the current conductor portion 333 of FIG. 3. The TMR, GMR, or vertical Hall element can be used to measure magnetic flux in a direction approximately parallel to the surface of die 308, which is the direction of the magnetic flux generated by current in the primary conductor over the current conductor portion 333. A second vertical Hall, GMR, TMR magnetic field sensing element may also be positioned over the current conductor portion 333. Other combinations of magnetic field sensing elements, including but not limited to planar Hall, vertical Hall, GMR, TMR, or AMR, may be placed in areas to the side of or the area over current conductor portion 333. The placement of the magnetic field sensing element will in part be determined by the axis of maximum sensitivity of the magnetic field sensing element type chosen, for example a planar Hall will have a maximum axis of sensitivity perpendicular to the plane of die 308, whereas a vertical Hall, GMR, TMR and AMR element will have a maximum axis of sensitivity parallel to the surface of die 308.

In another embodiment there may be only one magnetic field sensing element on die 308 located in the position of element 309a or 309b, or located over the current conductor portion 333. In another embodiment there may be additional magnetic field sensing elements. For example elements 309a, 309b, may contain multiple Hall elements, including but not limited to multiple dual Hall effect elements, or multiple quad Hall effect elements. Multiple magnetic field sensing elements may be only on one side or over of the current conductor portion 333. In an embodiment there may be only one magnetic field sensing element 309a, or 309b, or over the current conductor portion 333, and multiple magnetic field sensing elements in another location, or over the current conductor portion 333.

Figure 3A:
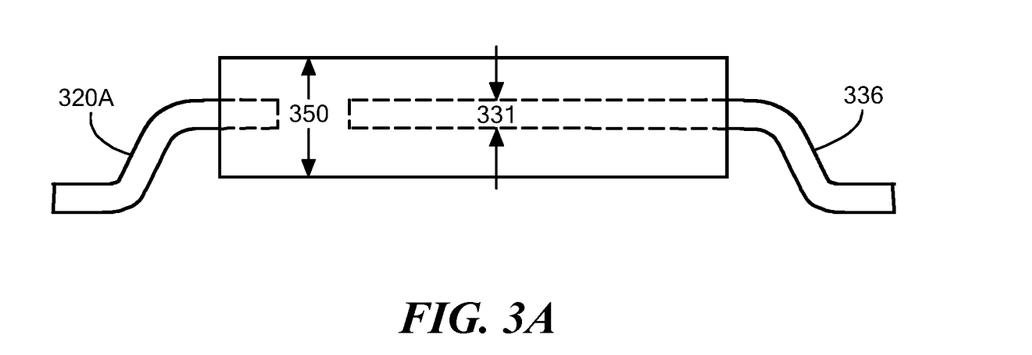
FIG. 3A shows a cross sectional side view along a line A to A' of FIG. 3.

FIG. 3A shows a side view of the current sensor integrated circuit 300 of FIG. 3 taken along the line A-A' of FIG. 3. The thinner lead frame thickness allows for a thinner or reduced molded package thickness 350. The reduced molded body package thickness 350 allows for improved mechanical vibration performance when the current sensor integrated circuit package 300 is assembled, for example, on a circuit board. In an embodiment the package thickness 350 is less than 1.0 mm. In another embodiment the package thickness has a range of 0.95 to 0.98 mm. In an embodiment the lead frame thickness 331 is nominally 150 microns, or 6 mils in thickness.

In an embodiment the current sensor integrated circuit 300 of FIGS. 3 and 3A may use a lead frame material thickness 331 of about 150 microns, or 6 mils, or a thin lead frame material. The lead frame thickness 331 may vary with fabrication tolerances between 5 and 7 mils, or approximately 125 and 175 microns (approximately 0.125 mm to 0.175 mm). In another embodiment the lead frame thickness may vary between 0.140 mm and 0.162 mm. A standard lead frame thickness of say an SOIC-8 style current sensor package may be nominally 200 microns, or 8 mils, ranging from 190 to 210 microns.

In order to achieve a dielectric isolation of 300V, the distance between the primary conductor 330 and the signals leads 320a, 320b, 320c should be nominally 0.160 mm, or about 6.4 mils, and with manufacturing tolerances the minimum distance should be at least 0.125 mm or about 5 mils. In an embodiment the secondary leads 320a, 320b, 320c are provided on a second opposite side of the package body from the primary input lead 336 and the primary output lead 338.

Die 308 is supported by the primary conductor die attach portions 332, 334. Die 308 may be attached to the die attach portions 332, 334 by a non-conductive coating, such as a wafer backside coating (WBC), which as shown in FIG. 1A may be two layers. In manufacturing, if two layers of wafer backside coating are used, the first wafer backside coating layer may be fully cured (or partially cured if only one layer of a wafer backside coating is used) before a second layer of wafer backside coating is partially cured (also known as B stage cured) and used to eventually attach die 308 to die attach portions 332, 334 of the primary conductor 330 of FIG. 3.

In another embodiment the die 308 may be attached to the die attach portions 332, 334 by other materials, including but not limited to by a non-conductive die attach epoxy, or a tape. Multiple layers of wafer backside coating, tape, and non-conductive epoxy may be used for electrical isolation.

A combination of wafer backside coating, tape, or non-conductive epoxy may be used to achieve electrical isolation and attachment to the die attach portions 332, 334.

In an embodiment primary conductor 330 may include filleted, contoured, or shaped conductor regions 358a, 358b, 358c, 358d between the die attach portions 332, 334 and the current conductor portion 333. In an embodiment the fillet may have a radius of approximately 0.20 mm or larger. In an embodiment the fillet dimension is between 0.18 mm and 0.30 mm. The shaped conductor regions 358a, 358b, 358c, 358d change the current flow in the primary conductor 330 such that the magnetic field generated by the current flow in the primary conductor is more uniform near the magnetic field sensing elements 309a, 309b, or over the current conductor portion 333 of the primary conductor 330. The more elongated shaped conductor regions 358a, 358b, 358c, 358d, provide a decrease in the error of the measured current in primary conductor portion 333 which allows a current sensor with a shaped conductor region to achieve a more accurate current measurement. In an embodiment the distance from die attach portion 332 to 334, shown as dimension 352 which includes the shaped conductor regions 358a, 358b, 358c, 358d and current conductor portion 333, is approximately 0.60 mm, and in an embodiment between 0.50 mm and 0.70 mm.

Primary conductor 330 may include mechanical locking features 355a, 355b which act to improve moisture sensitivity level (MSL) performance of the package, which is important for reliability. The mechanical locking features 355a, 355b are positioned such that the nearest edge 357a, 357b of a mechanical locking feature 355a, 355b, are positioned such that there is a space 353a, 353b between the die attach portion edges 351a, 351b which are adjacent to the primary input and output leads 336, 338, and the nearest edge 357a, 357b of mechanical locking features 355a, 355b. Any material removed from the primary conductor 330 can lead to an increase in resistance. By positioning a mechanical locking feature 355a, 355b outside of the primary current path 395 there will be less of an increase in resistance of the primary conductor 330. If a hole or holes were made in the primary conductor near the input lead 336 and/or output lead 338 the electrical resistance of the primary conductor 330 would increase since there would be less lead frame material for the current to flow through. The spacing 353a, 353b allows more lead frame material to remain intact in the primary current path 395, which maintains a lower resistance of the primary conductor when measured from input and output leads 336, 338 caused by removing lead frame material to form mechanical locking features 355a, 355b. In an embodiment the mechanical locking features 355a, 355b have a semicircular shape with a radius of 0.15 mm to 0.25 mm. In an embodiment the radius of the mechanical locking features 355a, 355b is nominally 0.20 mm. The die attach portion edges 351a, 351b are 0.2 mm inside of the package body 302 and the spacing 353a, 353b is at least 0.4 mm. In an embodiment the spacing 353a, 353b is between 0.4 mm and 0.6 mm. In an embodiment the spacing 353a, 353b is nominally 0.50 mm. In another embodiment the mechanical locking features 355a, 355b may have a spacing 353a, 353b of 0.0 mm. The shape of the mechanical locking features may be other than semicircular, including but not limited to holes in the primary conductor, rectangular cutouts, or triangular cutouts.

Current sensor integrated circuit 300 may have circuits similar to those shown in FIG. 2. The three signal leads 320a, 320b, 320c for current sensor integrated circuit 300 may be a Vcc, or input voltage or power pin or lead, an output pin or lead, and a ground or reference pin or lead. The current sensor integrated circuit 300 may have an output protocol circuit to provide an output protocol at the output lead or pin to allow more data to be transmitted from a single pin or output lead. In another embodiment a two-wire output may be used where data is transmitted by a change in the current provided at the Vcc or ground leads.

It is understood that any of the above-described processing may be implemented in hardware, firmware, software, or a combination thereof. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A packaged current sensor integrated circuit comprising:
   a primary conductor having an input lead and an output lead, a first die attach portion, a second die attach portion and a current conductor portion between the first and second die attach portions, wherein the primary conductor is configured to carry a current from the input lead through the first die attach portion, the current conductor portion, the second die attach portion, to the output lead, wherein at least one of the first and second die attach portions has a die attach portion edge adjacent to the respective one of the input or output lead;
   a mechanical locking feature spaced from the die attach portion edge and the current conductor portion;
   at least one secondary lead;
   a semiconductor die supported by the first and second die attach portions;
   at least one magnetic field sensing element supported by the semiconductor die;
   wherein the at least one magnetic field sensing element is positioned adjacent to the current conductor portion; and
   a package body enclosing the semiconductor die and at least a portion of the primary conductor, wherein the input lead and the output lead extend from a first side of the package body, and the at least one secondary lead extends from a second side of the package body opposite to the first side of the package body.

2. The packaged current sensor integrated circuit of claim 1 further comprising at least three secondary leads.

3. The packaged current sensor integrated circuit of claim 2 wherein at least one secondary lead provides an output connection, at least one secondary lead provides a voltage input connection, and at least one secondary lead provides a ground connection.

4. The packaged current sensor integrated circuit of claim 1 further comprising a front-end amplifier, wherein the at least one magnetic field sensing element is connected to the front-end amplifier.

5. The packaged current sensor integrated circuit of claim 1 wherein the at least one magnetic field sensing element is a Hall effect sensor.

6. The packaged current sensor integrated circuit of claim 5 further comprising a Hall effect current drive circuit connected to the Hall effect sensor.

7. The packaged current sensor integrated circuit of claim 5 wherein the Hall effect sensor is positioned adjacent to the current conductor portion of the primary conductor.

8. The packaged current sensor integrated circuit of claim 7 wherein the at least one magnetic field sensing element comprises a first Hall effect sensor positioned adjacent to a first side of the current conductor portion and wherein the packaged current sensor integrated circuit further comprises a second Hall effect sensor positioned adjacent to a second side of the current conductor portion opposite to the first side.

9. The packaged current sensor integrated circuit of claim 1 wherein a front end amplifier is connected to an amplifier to provide an output of the current level in the primary conductor.

10. The packaged current sensor integrated circuit of claim 1 further comprising a wafer backside coating material on a back side of the semiconductor die.

11. The packaged current sensor integrated circuit of claim 10 further comprising a second wafer backside coating material on the back of the semiconductor die.

12. The package current sensor integrated circuit of claim 1 wherein the distance between the primary conductor lead frame and the at least one secondary lead frame is at least 0.125 mm.

13. The packaged current sensor integrated circuit of claim 1 wherein the mechanical locking feature is spaced from the die attach edge portion by at least 0.50 mm.

14. The packaged current sensor integrated circuit of claim 1 wherein a current conductor portion of the primary conductor has shaped conductor regions.

15. The packaged current sensor integrated circuit of claim 1 wherein the thickness of the package body is less than 1.0 mm.

16. The packaged current sensor integrated circuit of claim 1 wherein the thickness of the primary conductor lead frame is between 0.140 mm and 0.162 mm.

17. A method of sensing a current in a current sensor integrated circuit package comprising:
providing a primary conductor having an input lead and an output lead, a first die attach portion, a second die attach portion and a primary conductor portion, wherein the primary conductor is configured to carry a current from the input lead through the first die attach portion, the primary conductor portion, the second die attach portion, and the output lead;
providing a mechanical locking feature in the primary conductor spaced from a die attach portion edge adjacent to the input lead or the output lead and from the primary conductor portion;
providing at least one secondary lead;
providing a semiconductor die disposed adjacent to the primary conductor;
providing at least one magnetic field sensing element supported by the semiconductor die;
wherein the at least one magnetic field sensing element is positioned near the primary conductor portion; and
providing an output signal representative of the current in the primary conductor.

18. The method of sensing a current in a current sensor integrated circuit package of claim 17, wherein the at least one magnetic field sensing element comprises a first magnetic field sensing element disposed adjacent to a first side of the primary conductor portion and wherein the method further comprises providing a second magnetic field sensing element disposed adjacent to a second side of the primary conductor portion opposite to the first side.

19. The method of sensing a current in a current sensor integrated circuit package of claim 17 wherein the at least one magnetic field sensing element is one of a planar Hall effect element, a vertical Hall effect element, a anisotropic magnetoresistance (amr) element, a giant magnetoresistance (gmr) element, or a tunneling magnetoresistance (tmr) element.

* * * * *

UNITED STATES PATENT AND TRADEMARK OFFICE
CERTIFICATE OF CORRECTION

PATENT NO. : 11,768,229 B2
APPLICATION NO. : 17/654254
DATED : September 26, 2023
INVENTOR(S) : Bradley Boden et al.

It is certified that error appears in the above-identified patent and that said Letters Patent is hereby corrected as shown below:

In the Specification

Column 4, Lines 2-3 delete "an analog or digital" and replace with --analog or digital--.

Column 5, Line 27 delete "is used" and replace with --and used--.

Column 5, Line 43 delete "on one etch side" and replace with --one etch side--.

Column 5, Line 59 delete "pads132," and replace with --pads 132,--.

Column 6, Line 15 delete "outside, or" and replace with --outside of--.

Column 8, Line 27 delete "may be introduce" and replace with --may introduce--.

Column 8, Line 55 delete "which can" and replace with --can--.

Column 10, Line 13 delete "over of" and replace with --over--.

Column 10, Line 65 delete "to by a non-conductive" and replace with --to a non-conductive--.

Signed and Sealed this
Eighth Day of October, 2024

Katherine Kelly Vidal
*Director of the United States Patent and Trademark Office*